United States Patent

Chung et al.

[11] Patent Number: 5,853,521
[45] Date of Patent: Dec. 29, 1998

[54] MULTI-CATHODE ELECTRON BEAM PLASMA ETCHER

[75] Inventors: Kie-hyung Chung, Pyongtaek; Kil-ju Yun, Puchon; Sang-young Kim, Songtan; Tae-Young Kim, Seoul, all of Rep. of Korea

[73] Assignees: Soosan Precision Co., Ltd., Chungchongnamdo; Korean Accelerator & Plasma Research Association, Seoul, both of Rep. of Korea

[21] Appl. No.: 587,906

[22] Filed: Jan. 16, 1996

[30] Foreign Application Priority Data

Jan. 16, 1995 [KR] Rep. of Korea ................... 793/1995

[51] Int. Cl.[6] ............................................. C23F 1/02
[52] U.S. Cl. ............... 156/345; 156/643.1; 118/723 E; 335/209; 335/210; 335/211; 335/212; 335/286; 335/288; 336/160; 336/165
[58] Field of Search ................................ 335/209–212, 335/336–337, 285–288; 336/98, 160, 165, 192, 198, 170, 178, 208; 156/345, 643.1; 118/723 E

[56] References Cited

U.S. PATENT DOCUMENTS 5,659,276  8/1997  Miyata ................................ 335/209
5,660,671  8/1997  Haraoa et al. ...................... 156/345

*Primary Examiner*—Laurie Scheiner
*Attorney, Agent, or Firm*—Sixbey, Friedman, Leedom & Ferguson; David S. Safran

[57] ABSTRACT

A multi-cathode electron beam plasma etcher is disclosed. The multi-cathode electron beam plasma etcher is comprised of: a vacuum chamber; several cathodes which are installed in the upper end of the upper part of the chamber and generates an electron beam in order to generate plasma in a large area; an acceleration electrode and a deceleration electrode which, form an acceleration and a deceleration tube structure in order to withdraw much of the electron beam, are arranged sequentially from the front of the cathode, and form an electrostatic lens when the differential voltage is applied respectively; first vacuum evacuation device to made the upper part of the chamber vacuum; an etching gas injection device which is installed in the side wall around the upper end of the lower part of the chamber; second vacuum evacuation device which is installed in the lower part of the chamber; and a holder of the etched body which is installed in the lower part of the chamber.

22 Claims, 2 Drawing Sheets

MULTI-CATHODE ELECTRON BEAM PLASMA ETCHER

FIELD OF THE INVENTION

This invention refers to multi-cathode electron beam plasma etcher, in particular to multi-cathode electron beam plasma etcher or MCEBPE, for large scale integrated semiconductor wafer in which the uniformity of the plasma density and temperature distribution can be controlled according to the etching area of the wafer.

BACKGROUND OF THE INVENTION

In general, a semiconductor manufacturing process includes: a design of a circuit pattern with an enlarged drawing; a reduction of the drawing; a masking of the circuit pattern on a silicon wafer (stepper lithography: an exposure development equipment, aluminum film); a dry etching or the etching of circuit in the form; and a coating or laminating process. The etching process in the semiconductor manufacturing process corresponds to the ultrafine etching process that is realized on the basis of the circuit pattern. For example, it is necessary that the minimum pattern width for a 64 Megabit DRAM, 256 Megabit DRAM should be about 0.25 $\mu$m and the etching depth should be about 1–2 $\mu$m. Specifically, the silicon semiconductor is slower than the composite semiconductor but has better integration, and thus it is often used in the etching technology.

Here, in prior art, the diode method—realizing oscillation as in two electrode vaccum tube—has been used in order to generate plasma source by which the ultrafine etching process can be performed, but recently, because the nonuniformity of plasma density, various methods such as the DC method, RF method, microwave method and electron beam method are also considered.

The basic principle of the various methods is as follows, The predetermined etching gas such as $SF_6$, $Cl_2$ are injected in the atmosphere of plasma generating chamber. Thereafter, plasma power is generated by electric field and plasma density is controlled by magnetic field (according to circumstances, in the form of external magnetic field).

In the basic principle as above, the concrete operation of etching is realized as follows, First, the etching gas is transformed into plasma state or ionized gas state by an electron beam by a DC, microwave or helicon wave according to the circumstances. If the relative voltage (–) is applied to the silicon wafer with the gas pressure of the activated ions (having+polarity) being controlled, the ions are accelerated, and thus, the kinetic energy of the particles is transformed into the thermal energy by the physical and chemical action. Therefore, the surface etching is realized according to the predetermined pattern.

The following include difficulties experienced with respect to the various plasma generating methods.

1. Diode method

The Diode method a traditional method using a two electrode vacuum tube as an osciating power where a high voltage electric field is applied to gases such as $SF_6$ or $Cl_2$ and said gases are transformed into plasma state according to the physical and chemical action. Each element, however, is damaged because it is difficult to control the high voltage electric field, and it is also difficult to use in the fine pattern process because of the high gas pressure required.

2. Microwave methods a) MERI (Magnetic Enhanced Reactive Ion etching)

The MERI method is where the material gas for plasma is injected in the state of a clean ultra vacuum and a static magnetic field, and where the plasma state is achieved through the radiation of microwaves generated by the voltage control. The problem, however, is that the real ion energy remains low.

b) ECR (Electron Cyclotron Resonance etching)

ECR is a method that is used in equipment manufactured by the Japanese where high density plasma can be generated under the low pressure of very high frequency (2.4 GHz). The voltage, however, applied to the wafer surface is nonuniform because of the magnetic field in the hermetic state and because it is also difficult to process a wafer larger than 10" in the diameter.

3. RF (Radio Frequency) methods a) H-W (Helicon Wave)

The H-W method is used in the equipment manufactured by Americans where plasma is generated according to the peculiar wave mode by the discharge of the high frequency wave in dozens of ranges of MHz in the static magnetic field and the control of the magnetic field extracted in the exitation coil. This method is advantageous in the respect that the voltage on the wafer surface is uniform and the plasma density is high in contrast to the ECR method. The problem, however, is that the plasma density becomes nonuniform when the wafers are 12", 14" in diameter as in, for example, a 64 Megabit DRAM, 256 MDRAM respectively.

b) TCP (Transformer Coupled Plasma)

The plasma field with a larger diameter can be generated by the induction field in which only the time variable magnetic field remains without the static magnetic field. The plasma density, however, decreases as one moves further away from the center portion to the outer portion of the plasma field.

Reviewing the conventionally used methods previously mentioned, in the ECR method, high density plasma can be generated under low gas pressure but it is difficult to generate an uniform plasma field with a large diameter because of the magnetic field.

The H-W method, that compensates for the disadvantage in the ECR method, is advantageous in the respect that the energy distribution of the charged particles (ion energy) is uniform, the control of the charged particles is easier, and the frequency used is lower than 2.45 GHz, the operation frequency of the ECR. In addition, the costs involved are lowered because a high electron density can be achieved in a low magnetic field. This method, however, has difficulty in generating the uniform electron density for silicon wafers which are greater than 10" in the diameter.

In the TCP method, the electron density can be effectively achieved without an external magnetic field by using a swirling type antenna, but the density distribution weakens as the wafer increases in diameter. In other words, the conventional methods used to process 6", 8" wafers for 16 Megabit DRAM, 32 Megabit DRAM respectively, are the previous mentioned methods of ECR, H-W, and TCP. In these methods, however, though etching is realized in the atmosphere of the generated plasma, in general the electron density is liable to be more concentrated on the center portion of the wafer. As the diameter of the wafer increases, the surface voltage difference between the center and outer portions of the wafer also increases resulting in a nonuniform etching. Thus, the problem generated is that the productivity and effectiveness of these methods are lower for wafers with larger diameters.

To solve this problem, an attempt to etch wafer in the state that the relatively low gas pressure remains and the magnetic field does not remain by using a nonmagnetized plasma field having larger diameters has been tried.

One attempt is the EBPE etching method in which special etching equipment is used for the etching of 12" silicon wafer for 64 Megabit MDRAM,256 Megabit DRAM.

The EBPE etching equipment, as shown in FIG.1, consists of three regions: a discharge region 21, an electron accelerated region 22, and a reactive region 23. A hot cathode 24 is a LaB6 filament, and argon gas is supplied into the discharge region 21 and the vertical magnetic field of 450 G is supplied in order to prevent the electron beam and plasma from diffusing in the inner wall of the vacuum chamber.

In this equipment, an electron beam, more than 30 A, is extracted uniformly through the orifice 4 on the cathode S2. This is due to the fact that the ions generated in the reaction chamber 23 are diffused toward the acceleration region 22. Since the energy of the electron beam can be set up by the energy which corresponds to the maximum electron collisional ionization cross section of reactive gas atoms, a high density plasma field can be generated in the reaction chamber 23. Also, This equipment is characterized in that the beam current, the energy and the gas pressure in the reaction chamber can be controlled independently. This characteristic is useful for maximizing the plasma parameters in the etching process. The electron beam must be diffused spreadly in the reaction chamber 23 in order to generate large plasma capacity. The magnetic field which is generated by the reverse magnetic coil which has a reverse pole to the coil 2 installed in the acceleration electrode diffuses the electron beam along diverging lines of magnetic force.

The permanent magnet 25 disperses the electron beam effectively in the center portion of the reaction chamber 23. The permanent magnet 25 is in the form of a donut with its external side end of N pole and its internal side end of S pole covered with stainless steel. Also, a multipolar magnet assembly is installed in the reaction chamber 23 in order to prevent ions and electrons from diffusing into the inner wall of the vacuum tube. Thus, a uniform and dense plasma field which is large in diameter can be generated.

But, prior EBPE equipment has difficulties in achieving uniform electron density on the wafer of a larger diameter (above 10") and since ions generated in the reaction chamber 23 diffuse backward to the acceleration region 22, the reaction of ions with the cathode, results in damage to the cathode and the reduction of the life of the cathode. In addition, pollution is generated from the by-product that is produced in the reaction of ions with the cathode, and is attached onto the surface of the wafer.

SUMMARY OF THE INVENTION

It is the object of this invention to provide multi-cathode electron beam plasma etcher in which uniform plasma density can be formed, temperature distribution can be easily controlled, and pollution can be checked by eliminating the reaction of ions with the cathode.

To achieve the above mentioned object, MCEBPE includes: several cathodes which are arranged circularly and symmetrically in a reaction room to generate uniform and wide plasma; and an acceleration-deceleration tube installed in the reaction room in order to extract many electron beams. Accordingly, uniform plasma density and temperature can be achieved by forming a state where the magnetic field does not remain in reaction room and the plasma density and temperature on the silicon wafer is thus controlled.

BRIEF DESCRIPTION OF THE DRAWINGS

The above object and other advantages of the present invention will become more apparent by describing in detail the preferred embodiment of the present invention with reference to the attached drawings, in which.

DETAILED DESCRIPTION OF THE PREFERRED EMBODIMENT

Figure 1:
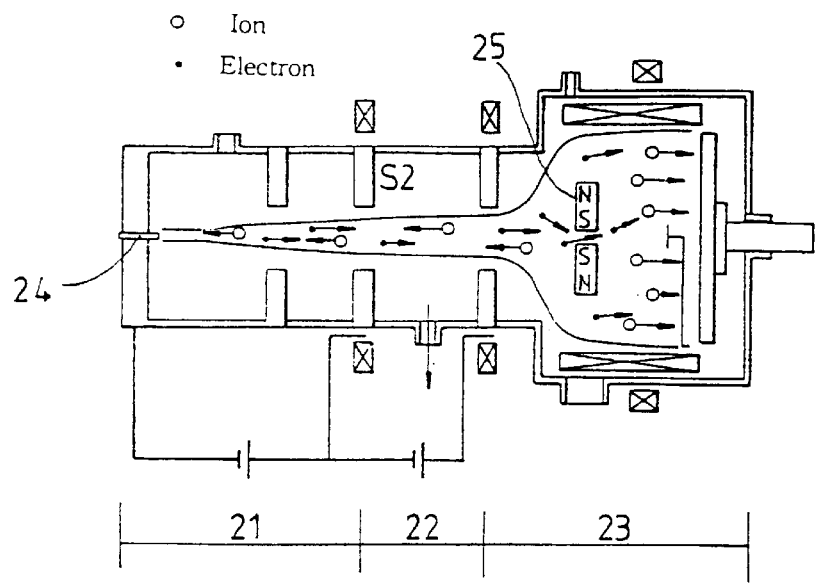
FIG. 1 is a sectional view showing the conventional EBPE etching equipment.

Referring now to the drawing wherein similar elements are designated with identical numerals throughout the several views, preferred embodiments of the present invention are shown in FIG. 2 to FIG. 6.

Figure 2:
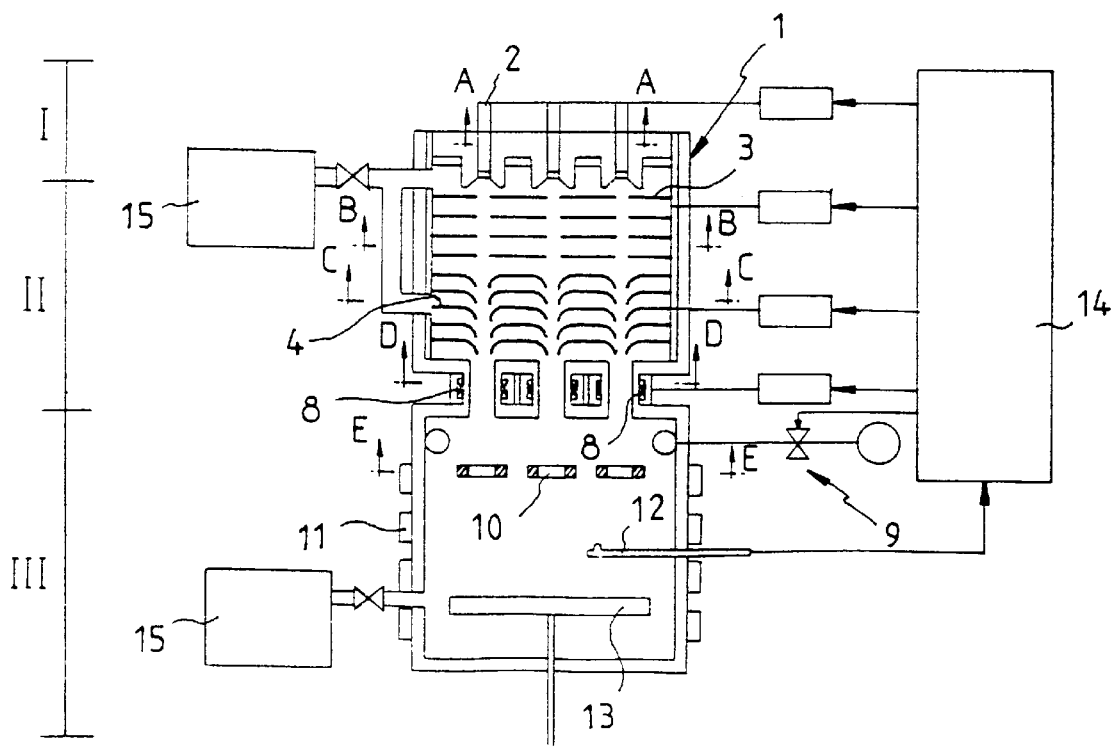
FIG. 2 is a sectional view showing the multi-cathode electron beam plasma etcher of the invention.

FIG. 2 is a picture showing the outline of one embodiment of the plasma etching equipment of the invention. The embodiment of the invention consists of three regions: the multicathode region(I), the electron acceleration-deceleration region(II) and the reaction region (III). The various parts of FIG. 2 are explained in hereinbelow.

Figure 3:
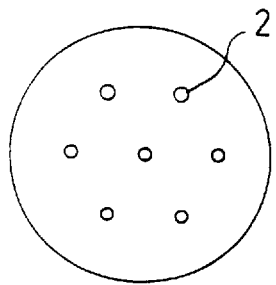
FIG. 3 is a sectional view showing the outline of the shape and arrangement of the multicathode according to the A—A line in FIG. 2.

The number 1 means vacuum chamber and consists of a upper plate, a lower plate and a cylindrical side plate. Several cathodes 2 for generating electron beam are installed in the upper plate in the vacuum tube 1 cylindrically and symmetrically. The cathode 2 is made up of LaB6 which has a superior property that allows the thermal electrons to be easily emitted. The cathode 2 is arranged cylindrically and symmetrically, as shown in FIG. 3, such that a concentric circle is formed to the center cathode by several cathodes. At this time, each cathode has the same construction.

Figure 4:
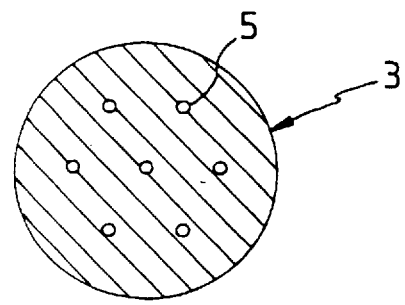
FIG. 4 is a sectional view showing the outline of the shape and arrangement of the acceleration electrode according to the B—B line in FIG. 2.
Figure 5:
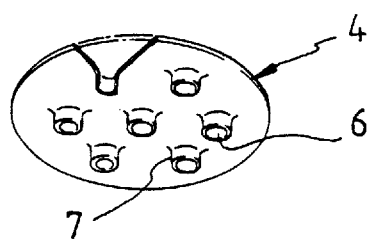
FIG. 5 is a perspective view showing the outline of the shape and arrangement of the deceleration electrode according to the C—C line in FIG. 2.

The acceleration electrode 3 and deceleration electrode 4 are installed in the upper part of inside of the vacuum chamber 1 and the acceleration electrode 3 in which the electron beam penetrating hole 5 is installed on the corresponding point to the cathode 2 has a plate form, as shown in FIG. 4. The deceleration electrode 4 in which the electron beam penetrating hole 6 is installed on the corresponding point to the cathode 2 has a plate form, as shown in FIG. 5, and a projection 7 is formed downward around the electron beam penetrating hole 6. The radius of the projection 7 is reduced gradually from the outer of the electron beam penetrating hole 6. The acceleration electrode 3 and the deceleration electrode 4 are arranged cylindrically and symmetrically so that the electron beam penetrating holes are arranged in the form of a concentric circle to the central electron beam penetrating hole at the center portion which corresponds to each cathode 2. Thus, the electron beam penetrating holes 5, 6 are formed at the position which corresponds to each cathode 2. Therefore, the electron beam which is generated in the cathode 2 can penetrate each acceleration electrode and deceleration electrode 3, 4.

Since electrostatic lenses, not shown, are formed between the multiple layers of the acceleration electrode 3 and the deceleration electrode 4, the acceleration electrode 3 and the deceleration electrode 4 act as a transporter of the electron beam. In other words, the electrostatic lenses which condense and diffuse the electron beam are formed by applying the difference voltage to each plate of the acceleration electrode 3 and the deceleration electrode 4. Higher voltage is applied to the acceleration electrode 3 than the cathode 2 and lower voltage is applied to the deceleration electrode 4 than the acceleration electrode 3.

The electron beam penetrating hole 6 of the deceleration electrode 4 prevents the ions which are generated in the reaction room from damaging the cathode 2 because the downward projection 7 makes the ions reversely accelerate. Therefore, the reversely accelerated ions can not arrive at the cathode, and pollution of the wafer surface is prevented after the etching process by the reduction of the reaction product.

Figure 6:
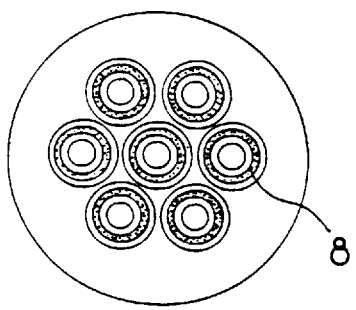
FIG. 6 is a sectional view showing the outline of the shape and arrangement of the lens according to the A—A line in FIG. 2.
Figure 7:
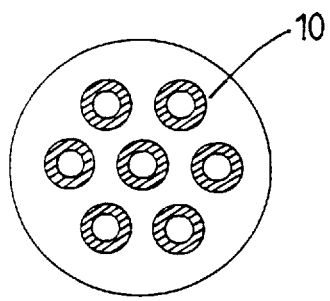
FIG. 7 is a sectional view showing the outline of the shape and arrangement of the permanent magnet according to the E—E line in FIG. 2.

The lens 8 is formed under the deceleration electrode 4 of the vacuum chamber 1 (as shown in FIG. 2) and the lens 8 is formed like a solenoid magnetic lens, as shown in FIG. 6 and consists of the solenoid magnetic lens and an iron pole piece formed around it. The lens is arranged such that the electron beam penetrating hole is formed at the position that corresponds to the cathode 2. The lens 8 condenses or diffuses the electron beam so that the distribution of the electron beam is controlled and the electron beam penetrates the electron beam penetrating hole of the condensing lens 8.

An etching gas injection means 9 is installed in the side wall under the lens in the vacuum chamber 1 and is able to control the density of plasma and the pressure of the etching gas.

The number 10 refers to a permanent magnet with a donut shape and is installed under the injection means 9 with its external side end being N pole and its internal side end being S pole. The permanent magnet 10 makes the density of plasma uniform by diffusing and diffracting the electron beam.

The number 11 is a multiple permanent magnet and is installed in the periphery of the lower part of the vacuum chamber 1 and prevents plasma from diffusing into the inside wall of the reaction room.

The number 12 is a plasma testing means and is installed in the front of the holder 13 of the etched body, as shown in FIG. 2, and measures the density of plasma and the electron temperature distribution, and regulates the operating point of the cathode 2, the acceleration electrode 3, the deceleration electrode 4, the lens 8, and the etching gas injection means 9 by the controller 14 to which the measured results are fed back.

The number 13 is a holder of the etched body such as a wafer, and the wafer is placed on the holder 13 and the voltage is applied in order to regulate the etching depth.

The number 15 are various kinds of vacuum pump systems and form the difference vacuum between the region (I), region(II) and region(III).

The preferred embodiment of the invention constructed as above operates as follows;

First, the cathode 2 is heated to a high temperature, for example, 1400–2000K. so that the electron beam is generated in the cathode. And then, if higher voltage, for example, more than 700V, is applied to the acceleration electrode 3 than what was applied to the cathode 2, the electron beam is projected. In the state that the glow discharged gas and the electron was mixed, the electron energy for maximum reaction rate for ionization is 50–500 eV. If the electron, however, is extracted by the above energy, the electron beam current is limited to small amount by the space charge effect. To solve this problem, in this preferred embodiment, after the electron beam having large current is extracted by applying high voltage (more than 700V) to the acceleration electrode 3, the energy of the electron beam is decreased to 50–500 eV at which the maximum reaction rate for ionization is realized in the deceleration electrode 4. Furthermore, the deceleration electrode 4 prevents the reversely accelerated etching ions among the etching plasma which is generated in the reaction room and thus, prevents the etching ions from colliding with the cathode. In prior EBPE, large current was formed by forming Ar plasma column. Therefore, the problem where the cathode is damaged and the life time of the cathode is shortened occurs because the Ar ions or the etching ions which are generated in the reaction room is accelerated reversely and thus, collides with the cathode. MCEBPE of the invention solves this problem by using the acceleration-deceleration tube structure.

The electron beam which is generated as above and has low energy and large current is condensed and diffused by the lens 8. The diffusion and distribution of the electron beam is controlled by regulating the intensity of the lens 8. The lens 8 consists of the solenoid lens and the iron pole piece which is formed around the solenoid lens and thus, the magnetic field generated in the lens 8 does not affect the reaction room. The permanent magnet 10 having a donut shape makes the electron beam be diverged and diffracted and thus, a more uniform current and plasma distribution is achieved. Since the magnetic field of the permanent magnet 10 having above form is only partially formed, the overall reaction room is not affected.

On the other hand, the etching plasma is formed by the discharging of the etching gas which is supplied from the etching gas injection means 9 and the electron beam which penetrates the lens 8 and the permanent magnet 10. Thus, the etching plasma achieves uniform density distribution through being diffused and diffracted. When the etching plasma generated in this manner is diffused to the lower part of the reaction room, the wafer is etched. In addition, the etching property is controlled by applying small voltage to the holder 13 of the etched body.

The multipolar permanent magnet 11 is attached to the side wall of the reaction room so that the etching plasma is diffused only downward and is not diffused in the radius direction. Also, the magnetic field is formed partially and thus, does not affect the overall reaction room.

The controller 14 controls all parameters of the cathodes 2, the acceleration electrode 3, the deceleration electrode 4, the lens 8 and the etching gas injection means 9 automatically by using the plasma testing means 12 which feeds back information concerning the etching plasma property.

The vacuum pump system 15 keeps the vacuum state of the regions I, II and III which keep the differential vacuum of ~0.01 mTorr, ~0.01 mTorr and ~1 mTorr respectively. At this time, the differential vacuum is formed through the acceleration and the deceleration electrode 3, 4 acting as orifices.

The multi-cathode electron beam plasma etcher of the invention can generate uniform plasma density in wide area because several electrodes are disposed cylindrically and symmetrically at regular intervals. Much of the electron beam can be extracted without pollution and damage of the cathode by using the acceleration and deceleration tube structure. The distribution of the plasma can be controlled by the electron beam because the plasma is generated at the reaction chamber in magnetic field non-remaining atmosphere.

What is claimed is:

1. A multi-cathode electron beam plasma etcher comprising:
   a vacuum chamber;
   several cathodes which are installed in the upper end of the upper part of the chamber and generates an electron beam in order to generate plasma in a large area;
   an acceleration electrode and a deceleration electrode which form an acceleration and a deceleration tube structure in order to extract much electron beam and are arranged sequentially from the front of the cathode and form an electrostatic lens when a differential voltage is applied respectively;
   first vacuum evacuation means to make the upper part of said chamber vacuum;
   an etching gas injection means which is installed in the side wall around the upper end of the lower part of said chamber;
   second vacuum evacuation means which is installed in the lower part of said chamber; and
   a holder of the etched body which is installed in the lower part of said chamber;
   wherein a lens is included additionally in the inside of the chamber between the deceleration electrode and the etching gas injection means in order to control the dispersion and distribution of the electron beam, condense the electron beam and then, diffuse the electron beam.

2. The multi-cathode electron beam plasma etcher of claim 1 wherein permanent magnets of a donut shape are included additionally in the inside of the chamber between the etching gas injection means and the holder of the etched body in order that the density of the plasma be uniform by diffusing and diffracting the electron beam.

3. The multi-cathode electron beam plasma etcher of claim 1 wherein multipolar permanent magnets which are installed in the outer side wall of the reaction room are included additionally in order that the plasma which is generated in the reaction room of the lower part of the chamber may not be diffused into the inside wall of the reaction room.

4. The multi-cathode electron beam plasma etcher of claim 2 wherein multipolar permanent magnets which are installed in the outer side wall of the reaction room are included additionally in order that the plasma which is generated in the reaction room of the lower part of the chamber may not be diffused into the inside wall of the reaction room.

5. The multi-cathode electron beam plasma etcher of claim 1 wherein the multi-cathode electron beam plasma etcher additionally includes: a plasma measuring means which is installed in the front of the holder of the etched body and measures the plasma density and the electron temperature distribution; and
   a controller which controls the several cathodes, the acceleration electrode, the deceleration electrode and the etching gas injection means by feeding back the measured results.

6. The multi-cathode electron beam plasma etcher of claim 1 wherein the multi-cathode electron beam plasma etcher additionally includes a plasma measuring means which is installed in the front of the holder of the etched body and measures the plasma density and the electron temperature distribution; and a controller which controls the several cathodes, the acceleration electrode, the deceleration electrode, the etching gas injection means and the condensing means by feeding back the measured results.

7. The multi-cathode electron beam plasma etcher of claim 1 wherein a solenoid magnetic lens is provided in the center portion of the lens and an iron pole piece is formed around the lens.

8. The multi-cathode electron beam plasma etcher of claim 2 wherein a solenoid magnetic lens is provided in the center portion of the lens and an iron pole piece is formed around the lens.

9. The multi-cathode electron beam plasma etcher of claim 3 wherein a solenoid magnetic lens is provided in the center portion of the lens and an iron pole piece is formed around the lens.

10. The multi-cathode electron beam plasma etcher of claim 4 wherein a solenoid magnetic lens is provided in the center portion of the lens and an iron pole piece is formed around the lens.

11. The multi-cathode electron beam plasma etcher of claim 5 wherein a solenoid magnetic lens is provided in the center portion of the lens and an iron pole piece is formed around the lens.

12. The multi-cathode electron beam plasma etcher of claim 6 wherein a solenoid magnetic lens is provided in the center portion of the lens and an iron pole piece is formed around the lens.

13. The multi-cathode electron beam plasma etcher of claim 1 wherein the electron beam penetrating hole is formed on the position of the deceleration electrode which corresponds to the position where the cathodes are arranged; and projections are protruded downward in the vacuum chamber.

14. The multi-cathode electron beam plasma etcher of claim 2 wherein the electron beam penetrating hole is formed on the position of the deceleration electrode which corresponds to the position where the cathodes are arranged; and projections are protruded downward in the vacuum chamber.

15. The multi-cathode electron beam plasma etcher of claim 1 wherein permanent magnets of a donut shape are included additionally in the inside of the chamber between the etching gas injection means and the holder of the etched body in order that the density of the plasma be uniform by diffusing and diffracting the electron beam.

16. The multi-cathode electron beam plasma etcher of claim 1 wherein multipolar permanent magnets which are installed in the outer side wall of the reaction room are included additionally in order that the plasma which is generated in the reaction room of the lower part of the chamber may not be diffused into the inside wall of the reaction room.

17. The multi-cathode electron beam plasma etcher of claim 1 wherein the electron beam penetrating hole is formed on the position of the deceleration electrode which corresponds to the position where the cathodes are arranged; and projections are protruded downward in the vacuum chamber.

18. The multi-cathode electron beam plasma etcher of claim 15 wherein multipolar permanent magnets which are installed in the outer side wall of the reaction room are included additionally in order that the plasma which is generated in the reaction room of the lower part of the chamber may not be diffused into the inside wall of the reaction room.

19. The multi-cathode electron beam plasma etcher of claim 15 wherein a solenoid magnetic lens is provided in the center portion of the lens and an iron pole piece is formed around the lens.

20. The multi-cathode electron beam plasma etcher of claim 16 wherein a solenoid magnetic lens is provided in the center portion of the lens and an iron pole piece is formed around the lens.

21. The multi-cathode electron beam plasma etcher of claim 18 wherein a solenoid magnetic lens is provided in the center portion of the lens and an iron pole piece is formed around the lens.

22. The multi-cathode electron beam plasma etcher of claim 15 wherein the electron beam penetrating hole is formed on the position of the deceleration electrode which corresponds to the position where the cathodes are arranged; and projections are protruded downward in the vacuum chamber.

\* \* \* \* \*